(12) United States Patent
McBride et al.

(10) Patent No.: US 11,176,448 B2
(45) Date of Patent: *Nov. 16, 2021

(54) ENHANCING PROCESSING PERFORMANCE OF A DNN MODULE BY BANDWIDTH CONTROL OF FABRIC INTERFACE

(71) Applicant: Microsoft Technology Licensing, LLC, Redmond, WA (US)

(72) Inventors: Chad Balling McBride, North Bend, WA (US); Timothy Hume Heil, Kirkland, WA (US); Amol Ashok Ambardekar, Redmond, WA (US); George Petre, Redmond, WA (US); Kent D. Cedola, Bellevue, WA (US); Larry Marvin Wall, Seattle, WA (US); Boris Bobrov, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/843,800

(22) Filed: Apr. 8, 2020

(65) Prior Publication Data

US 2020/0233820 A1 Jul. 23, 2020

Related U.S. Application Data

(63) Continuation of application No. 15/950,644, filed on Apr. 11, 2018, now Pat. No. 10,628,345.
(Continued)

(51) Int. Cl.
*G06F 1/32* (2019.01)
*G06F 9/46* (2006.01)
(Continued)

(52) U.S. Cl.
CPC ............ *G06N 3/063* (2013.01); *G06F 1/324* (2013.01); *G06F 1/3275* (2013.01);
(Continued)

(58) Field of Classification Search
CPC .......... G06F 1/324; G06F 1/3275; G06F 9/46; G06F 17/15; G06N 3/0454; G06N 3/049; G06N 3/06; G06N 3/0635; G06N 3/08
See application file for complete search history.

(56) References Cited

U.S. PATENT DOCUMENTS 7,480,640 B1 1/2009 Elad et al.
7,694,084 B2 4/2010 Raghavan et al.
(Continued)

OTHER PUBLICATIONS

MPC8610FS, Integrated host processor, Freescale Semiconductor, Inc., 2 pages (Year: 2007).*
(Continued)

*Primary Examiner* — Stefan Stoynov
(74) *Attorney, Agent, or Firm* — Newport IP, LLC; Han K. Gim

(57) ABSTRACT

An exemplary computing environment having a DNN module can maintain one or more bandwidth throttling mechanisms. Illustratively, a first throttling mechanism can specify the number of cycles to wait between transactions on a cooperating fabric component (e.g., data bus). Illustratively, a second throttling mechanism can be a transaction count limiter that operatively sets a threshold of a number of transactions to be processed during a given transaction sequence and limits the number of transactions such as multiple transactions in flight to not exceed the set threshold. In an illustrative operation, in executing these two exemplary calculated throttling parameters, the average bandwidth usage and the peak bandwidth usage can be limited. Operatively, with this fabric bandwidth control, the process-
(Continued)

ing units of the DNN are optimized to process data across each transaction cycle resulting in enhanced processing and lower power consumption.

20 Claims, 9 Drawing Sheets

Related U.S. Application Data

(60) Provisional application No. 62/486,432, filed on Apr. 17, 2017.

(51) Int. Cl.

| | | |
|---|---|---|
| G06F 17/15 | (2006.01) | |
| G06N 3/04 | (2006.01) | |
| G06N 3/06 | (2006.01) | |
| G06N 3/08 | (2006.01) | |
| G06N 3/063 | (2006.01) | |
| G06F 12/0862 | (2016.01) | |
| G06F 1/324 | (2019.01) | |
| G06F 3/06 | (2006.01) | |
| G06F 9/38 | (2018.01) | |
| G06F 12/08 | (2016.01) | |
| G06F 12/10 | (2016.01) | |
| G06F 15/80 | (2006.01) | |
| G06N 3/10 | (2006.01) | |
| H03M 7/30 | (2006.01) | |
| H04L 12/715 | (2013.01) | |
| H04L 29/08 | (2006.01) | |
| G06F 9/30 | (2018.01) | |
| G06F 13/16 | (2006.01) | |
| G06F 1/3234 | (2019.01) | |
| G06F 12/02 | (2006.01) | |
| G06F 13/28 | (2006.01) | |
| H03M 7/46 | (2006.01) | |
| H04L 12/723 | (2013.01) | |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | |
|---|---|---|
| 8,892,488 B2 | 11/2014 | Qi et al. |
| 8,966,413 B2 | 2/2015 | Shacham et al. |
| 9,015,096 B2 | 4/2015 | Hunzinger |
| 9,143,393 B1 | 9/2015 | Bird et al. |
| 9,378,044 B1 | 6/2016 | Gaurav et al. |
| 2008/0168013 A1* | 7/2008 | Cadaret ............. G06K 9/00986 706/20 |
| 2016/0267377 A1 | 9/2016 | Pan et al. |
| 2016/0350653 A1 | 12/2016 | Socher et al. |
| 2017/0199902 A1 | 7/2017 | Mishra et al. |

OTHER PUBLICATIONS

"Notice of Allowance Issued in U.S. Appl. No. 15/694,663", dated May 8, 2020, 9 Pages.

* cited by examiner

ENHANCING PROCESSING PERFORMANCE OF A DNN MODULE BY BANDWIDTH CONTROL OF FABRIC INTERFACE

CROSS-REFERENCE TO RELATED APPLICATIONS

This application claims priority under 35 U.S.C. § 119(e) to U.S. patent application Ser. No. 15/950,644, filed on Apr. 11, 2018 and titled "Enhancing Processing Performance of a DNN Module by Bandwidth Control of Fabric Interface," which claims priority to U.S. Provisional Patent Application No. 62/486,432, filed on Apr. 17, 2017 and titled "Enhanced Neural Network Designs," the entire disclosures of which are expressly incorporated in their entirety by their reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be in non-battery powered devices, such as a power-over-Ethernet ("POE") security camera for example In this specific example, POE switches can provide only a limited amount of power, and reduced power in POE devices like security cameras results in lower power consumption and cost of POE switches.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

Current practices provide for various mechanisms to manage memory and/or processing to ensure a balance between requesting components for shared resources of an exemplary computing environment. With current practices, such memory/processor management falls short to optimize the overall utility of each of the available processing elements such as neurons of a cooperating DNN chip. Moreover, current practices focus on overall processing/memory management of the system without possible regard to the overall power consumption and processing performance of the DNN chip.

It is with respect to these and other technical challenges that the disclosure made herein is presented.

SUMMARY

A neural network module is disclosed that can enhance the processing performance of the module's processing units by ensuring uniform utility of the processing units as well as reducing power consumption by enhanced memory management. Other technical benefits not specifically mentioned herein can also be realized through implementations of the disclosed subject matter.

In order to realize the technical benefits mentioned briefly above, illustratively, in an exemplary computing environment having a DNN module, the DNN's internal data transfer component can maintain one or more bandwidth throttling mechanisms. In an illustrative implementation, a first throttling mechanism can specify the number of cycles to wait between transactions on a cooperating fabric component (e.g., data bus). By way of example, if the value for the number of cycles to wait between transactions is set to zero, then a gap is not inserted between transactions and the data transfers can occur at the maximum transfer rate of the fabric. In another illustrative implementation, a second throttling mechanism can be a transaction count limiter that operatively sets a threshold of a number of transactions to be processed during a given transaction sequence and limits the number of transactions such as multiple transactions in flight to not exceed the set threshold. In an illustrative operation, in executing these two calculated throttling parameters, the average bandwidth usage and the peak bandwidth usage can be limited. In the illustrative operation, these throttling parameters can be executed to one or more selected cooperating memory components of the exemplary computing environment. In the illustrative operation, one or more cooperating processing units such as neurons are provided data at a rate to optimize their utility to avoid a neuron being idle during a transaction processing sequence. A transaction processing cycle can be considered the number of transactions to be processed by an exemplary computing environment during a selected unit of time.

As discussed briefly above, implementations of the technologies disclosed herein provide enhanced processing performance and reduced power consumption by the DNN module given that DNN module can optimize the bandwidth available to the cooperating processing units of the exemplary neural network environment. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
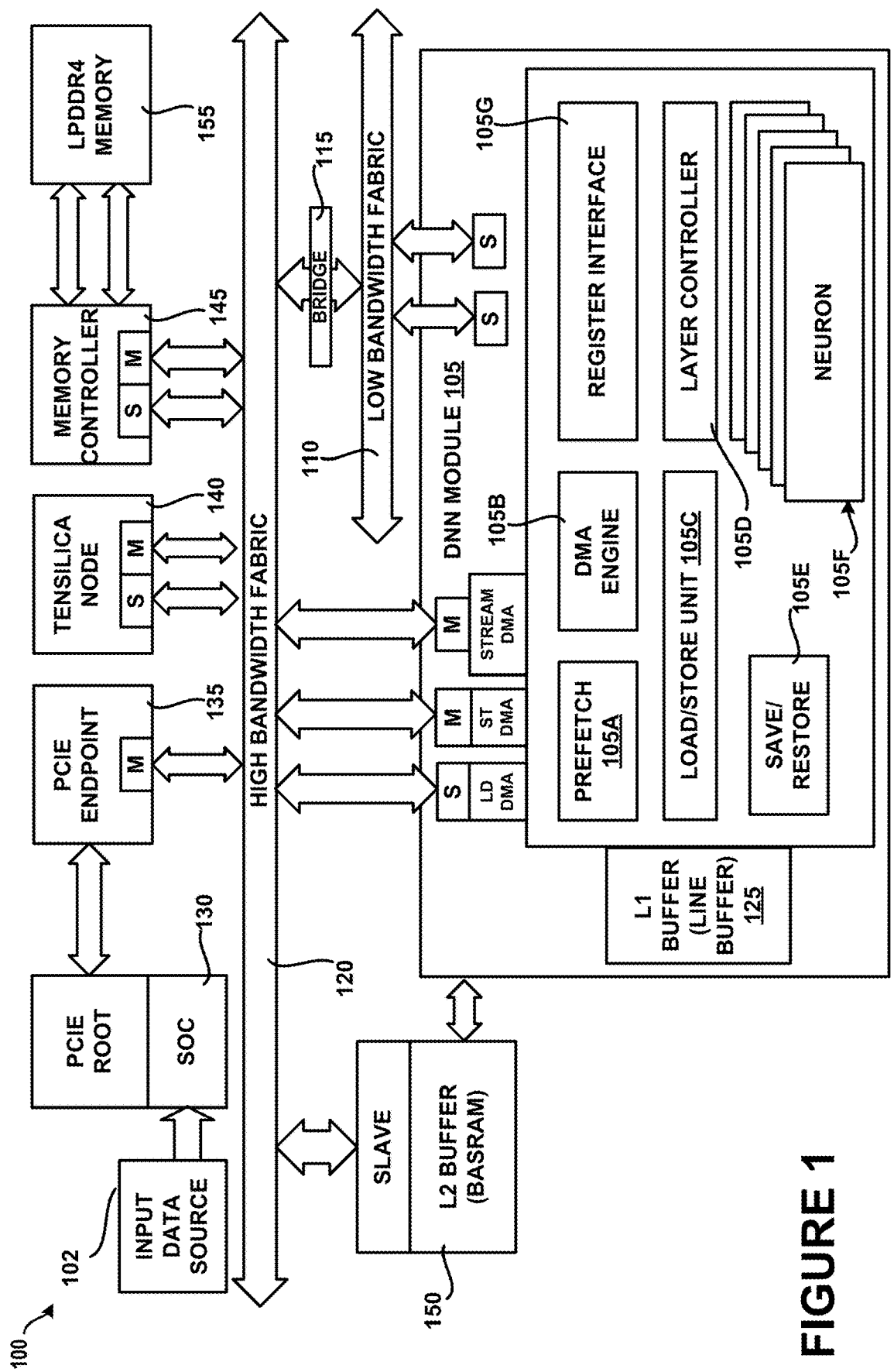
FIG. 1 is a computing architecture diagram that shows aspects of the configuration and operation of a DNN module that implements aspects of the technologies disclosed herein, according to one embodiment.

The following detailed description is directed to a neural network module that can enhance the processing performance of the module's processing units by ensuring uniform utility of the processing units as well as reducing power consumption by enhanced memory management. As discussed briefly above, implementations of the technologies disclosed herein provide enhanced processing performance and reduced power consumption by the DNN module given that DNN module can optimize the bandwidth available to the cooperating processing units of the exemplary neural network environment. Other technical benefits not specifically mentioned herein can also be realized through implementations of the disclosed subject matter.

In order to realize the technical benefits mentioned briefly above, illustratively, in an exemplary computing environment having a DNN module, the DNN's internal data transfer component can maintain one or more bandwidth throttling mechanisms. In an illustrative implementation, a first throttling mechanism can specify the number of cycles to wait between transactions on a cooperating fabric component (e.g., data bus). By way of example, if the value for the number of cycles to wait between transactions is set to zero, then a gap is not inserted between transactions and the data transfers can occur at the maximum transfer rate of the fabric. In another illustrative implementation, a second throttling mechanism can be a transaction count limiter that operatively sets a threshold of a number of transactions to be processed during a given transaction sequence and limits the number of transactions such as multiple transactions in flight to not exceed the set threshold.

In an illustrative operation, in executing these two calculated throttling parameters, the average bandwidth usage and the peak bandwidth usage can be limited. In the illustrative operation, these throttling parameters can be executed to one or more selected cooperating memory components of the exemplary computing environment. In the illustrative operation, one or more cooperating processing units such as neurons are provided data at a rate to optimize their utilization of computations during memory transfers. A transaction can be considered a memory transfer operation of an arbitrary region of memory to another (equal sized) region of memory.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a exemplary DNN module having enhanced processing and utilizing less power by bandwidth control of a cooperating fabric interface will be described.

FIG. 1 is a computing architecture diagram that shows aspects of the configuration and operation of a deep neural network ("DNN") module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with an activation function applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F is synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1). By having multiple accumulators, the neurons 105F are able to maintain context for multiple different active kernels at a time. Each accumulator is capable of being loaded from a read of the BaSRAM 150 (described below). The accumulators can sum themselves with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the term activation data is used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step rectified linear unit (ReLu)function, or another type of function. The activation function allows the neurons 105F to train to a larger set of inputs and desired outputs where classification boundaries are non-linear.

The DNN module 105 operates on a list of layer descriptors which correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be several main classes of descriptors: memory-to-memory move ("M2M") descriptors, configuration descriptors, and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operational descriptors specify a specific operation that the neurons 105F should perform on a data structure located in local static random access memory ("SRAM") memory. The operational descriptors are processed in order and are capable of many different layer operations, at least some of which are described herein.

As illustrated in FIG. 1, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity (e.g., one megabyte (1 MB)) with a high speed private interface operating at a selected frequency (e.g., sixteen giga-bits per second (16 GBps)). The L1 buffer 125 can maintain a selected storage capacity (e.g., eight kilobytes (8 KB)) that can be split between kernel and activation data. The L1 buffer 125 might be referred to herein as the "line buffer 125," and the L2 buffer 150 might be referred to herein as the BaSRAM 150.

Computational data (i.e. inputs data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise a number of other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 2:
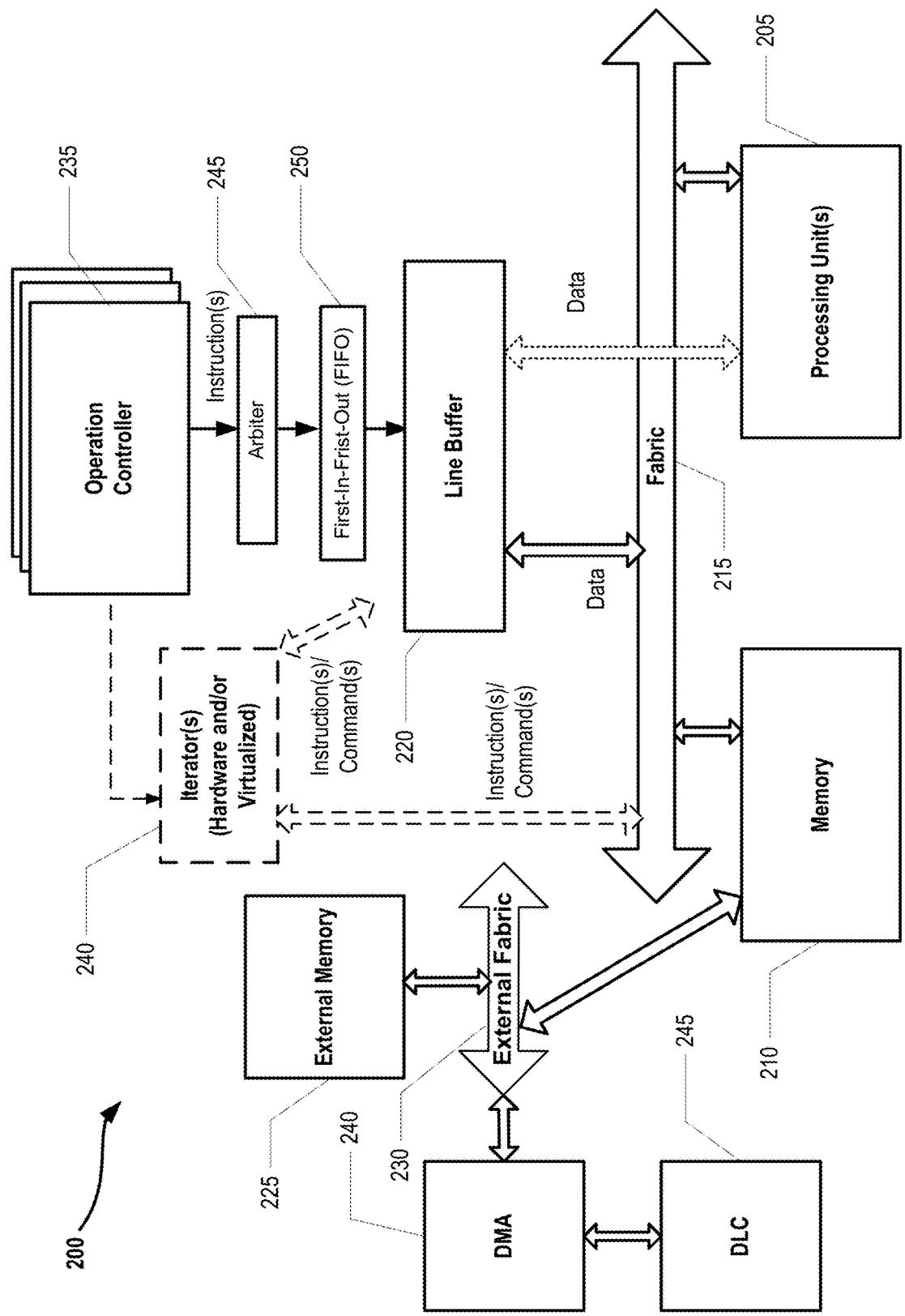
FIG. 2 illustrates a block diagram of an exemplary neural networking environment having cooperating components in accordance with the herein described systems and methods.

FIG. 2 illustrates an exemplary neural network environment 200 operable to employ a directed line buffer 220 as part of data processing. As is shown, the exemplary neural network environment 200 (also referred to herein as a computing device or a computing device environment) comprises one or more operation controllers 235 that cooperate with line buffer 220 to provide one or more instructions for data processing through cooperating component arbiter 245 and cooperating component first-in-first-out (FIFO) buffer 250. Line buffer 220 can operate to receive data from cooperating external memory component 225 through external fabric 230 and fabric 215 as well as operating to receive one or more instructions/commands from iterator(s) 240 (e.g., hardware based and/or virtualized iterators) (e.g., an instruction/command to read data from a cooperating memory component and/or an instruction to write data loaded from the cooperating memory component in the line buffer). Furthermore, as is shown in FIG. 2, exemplary neural network environment can also include direct memory access module (DMA) module 240 and data link control (DLC) module 245. In an illustrative operation cooperating component arbiter 245 can receive data instructions and route such instructions according to one or more selected routing paradigms. Illustratively, FIFO buffer 250 can operatively receive an instruction and pass it along to one or more other cooperating DNN environment components on a first-in/first out basis.

Operatively, line buffer 220 can shift data according to a selected stride width according to one or more instructions received from one or more operation controller(s) 235 (also referred to herein as a "cooperating controller component 235"). Furthermore, line buffer 220 can cooperate with processing unit(s) (e.g., neuron(s)) to provide the written bit shifted data for further processing directly or indirectly through fabric 215. A neural network environment fabric can be a data bus capable of passing through various data. A directed line buffer can be considered as a memory component capable of reading and writing data and/or data elements according to one or more received instructions.

Operatively DMA module 240 can cooperate with DLC module 245 to provide instructions to throttle external fabric to process data to/from external memory 225 and memory 210. In an illustrative operation, the DMA module 240 can provide one or more instructions to throttle processing of data across external memory 225 and/or memory 210 according to a selected throttling protocol including but not limited to inserting a gap between memory elements processed to and/or from one or more of the cooperating memory components (e.g., 210 and 225) and to limit the number of transactions performed on the data being stored/retrieved from one or more cooperating memory components (e.g., 210 and 225). Other throttling techniques can include limiting the operation of one or more processing units 205 during a given processing cycle. Illustratively, DMA module 240 can operate on one or more configurable registers (not shown) resident in one or more of the cooperating memory components 210 and 225.

Figure 6:
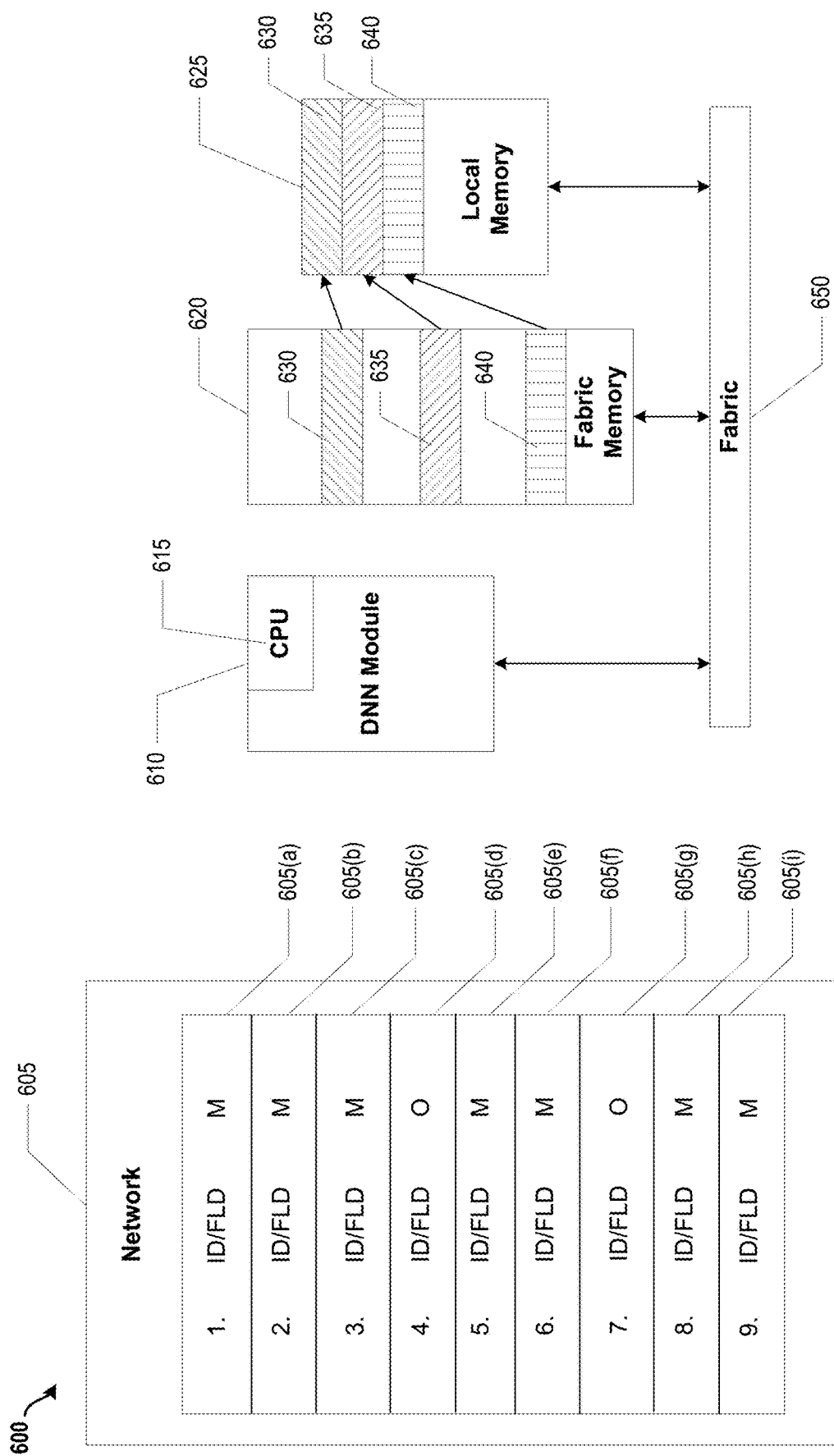
FIG. 6 is a block diagram showing the interaction of various components of an exemplary neural network environment operative to perform bandwidth control over an exemplary fabric interface in accordance with the herein described systems and methods.
Figure 7:
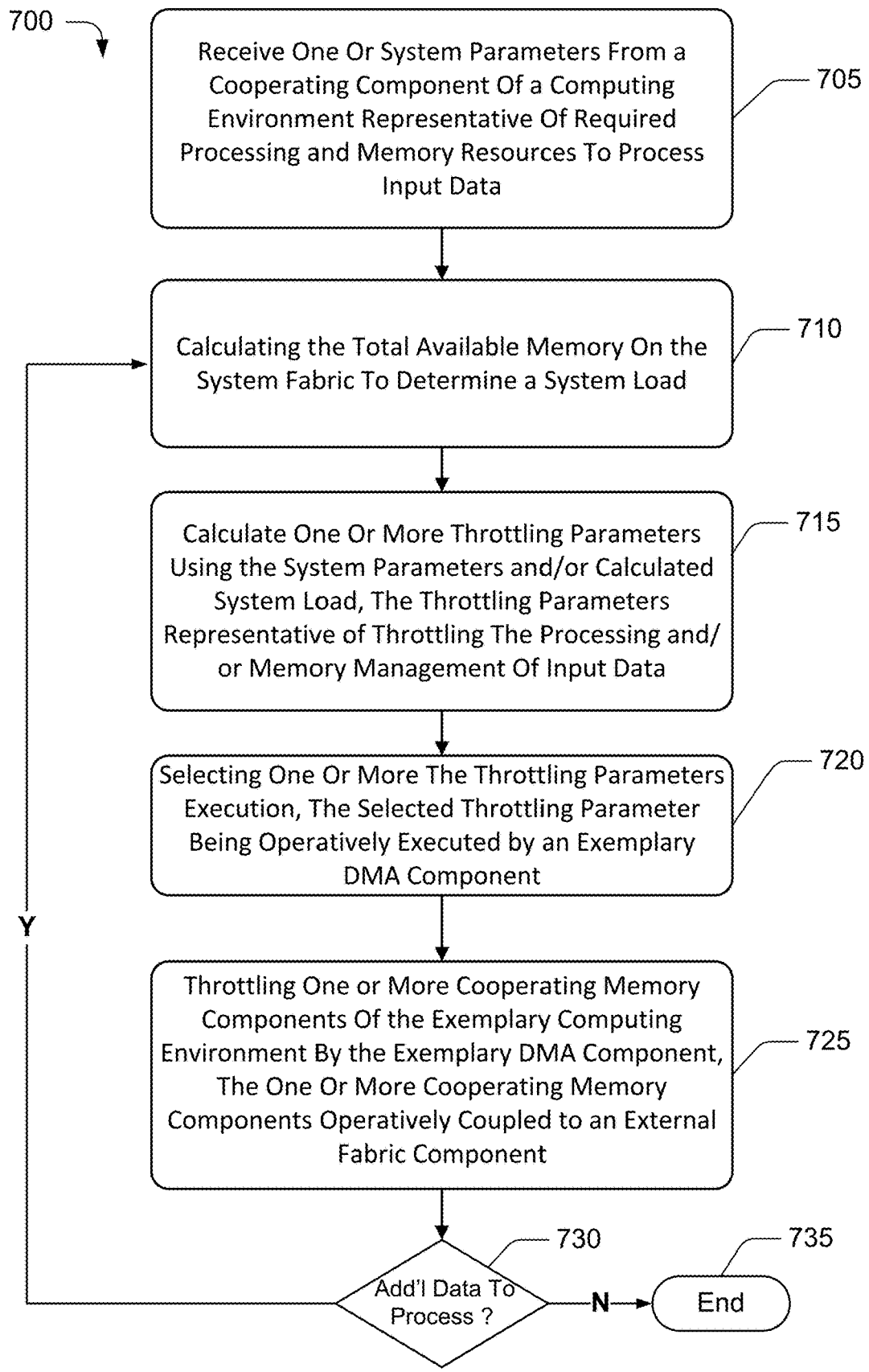
FIG. 7 is a flow diagram of an illustrative process for processing data according to bandwidth control of an exemplary fabric interface in an illustrative neural networking computing environment.

In the illustrative operation, the exemplary neural network environment 200 can operatively process data according to the process described in FIG. 7. Specific to the components described in FIG. 2, these components are merely illustrative, as one of ordinary skill in the art would appreciate the processing described in FIGS. 6 and 7 to be also performed by other components than those illustrated in FIG. 2.

Also, as is shown in FIG. 2, the exemplary neural network environment can optionally include one or more iterators (e.g., hardware based and/or virtualized iterators) (as indicated by the dashed lines) that can illustratively operate to iterate input data (not shown) for processing by one more neuron processors 205. It is appreciated by one skilled in the art that such optional inclusion of exemplary one or more iterators is merely illustrative as the inventive concepts described by the herein disclosed systems and methods are operative in an exemplary neural network environment 200 operating without any iterators.

Figure 3:
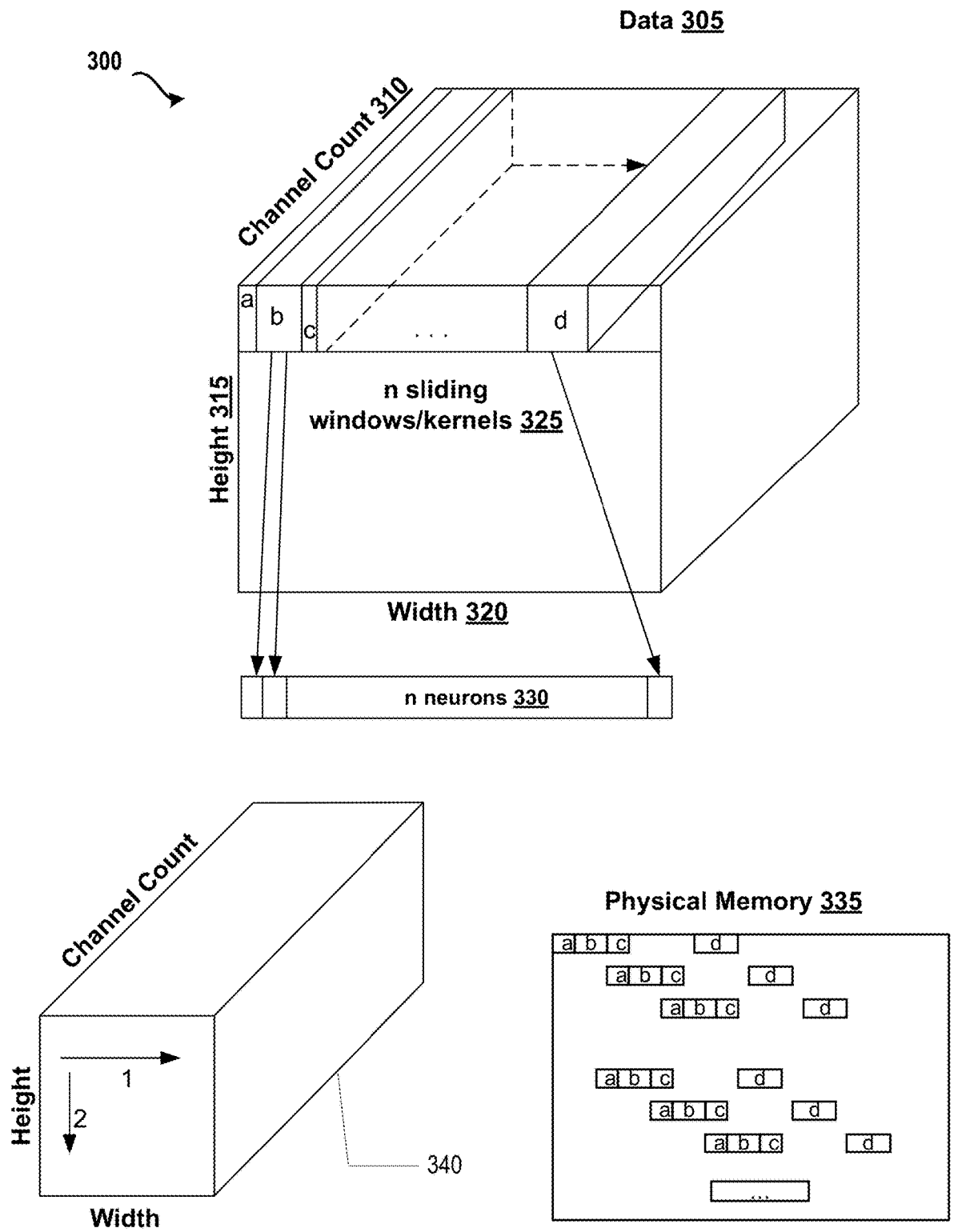
FIG. 3 illustrates a block diagram of exemplary input data represented in an illustrative logical data mapping according to the herein described systems and methods.

FIG. 3 illustrates an example logical data mapping 300 for exemplary input data. As is shown, data 305 can be represented as data having a certain dimension 340 (e.g., such that data dimensions taken as a whole can define a data volume) comprising channel count 310, height 315, and width 320. According to the herein described systems and methods, data 305 can be portioned and prepared for processing by cooperating n neurons 330 such that a first portion a can be communicated to a first neuron, a second portion b can be communicated to a second neuron, and so forth until n portions are communicated to n neurons.

In an illustrative operation, the portions of data 305 can be determined using n sliding window/kernels 325 based on one or more instructions provided by a cooperating controller component of an exemplary neural network environment (e.g., 200 of FIG. 2). Further, as is shown, the input data portions a, b, c, and d can be addressed to a physical memory 325 using one or more initialization parameters provided by a cooperating operation controller component (235) of an exemplary neural network environment (e.g., 200 of FIG. 2).

Figure 4:
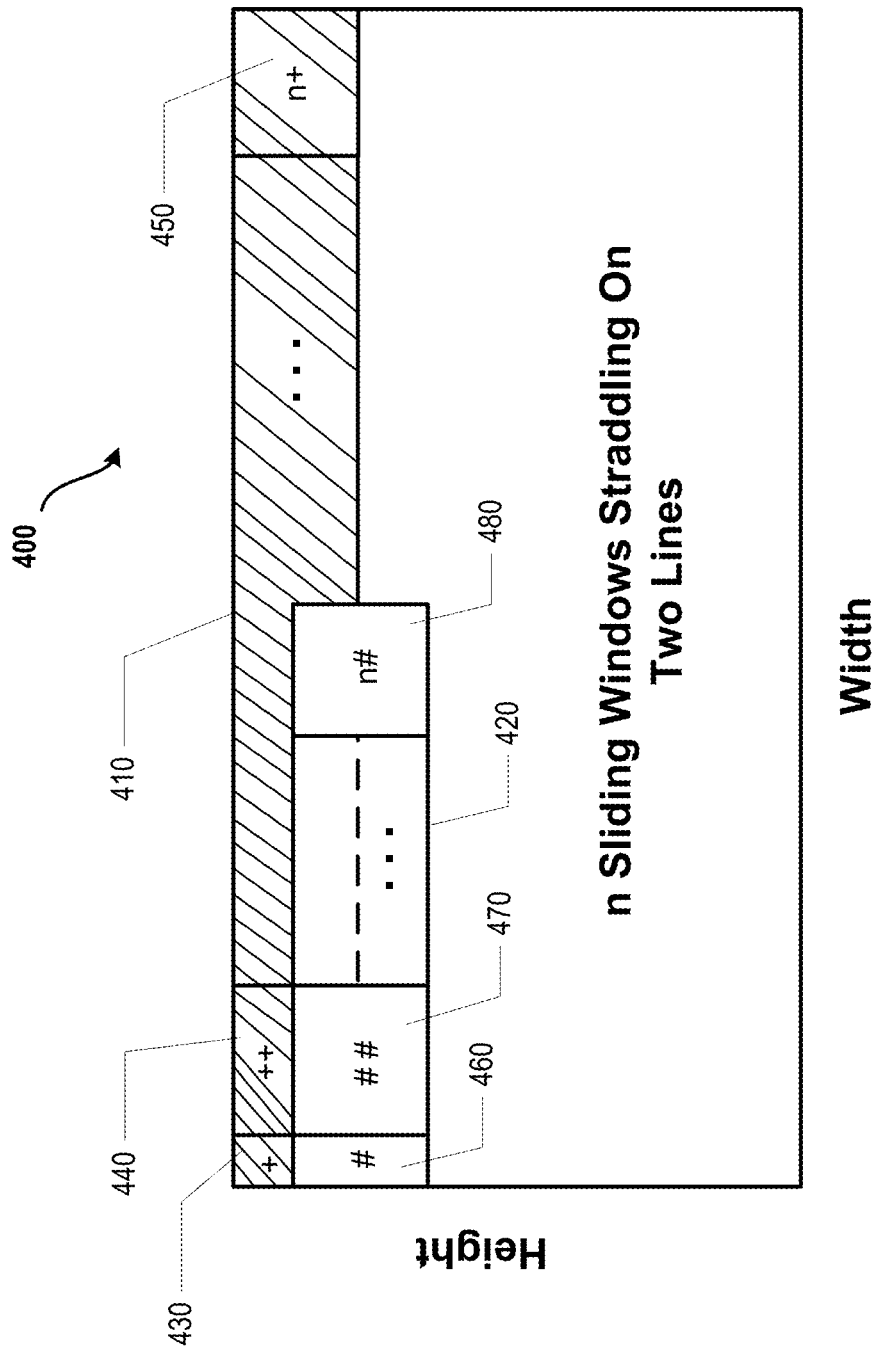
FIG. 4 illustrates a block diagram of exemplary input data represented in an illustrative logical data mapping showing the use of illustrative n sliding windows operative to straddle one or more lines of the illustrative logical data mapping

FIG. 4, illustrates an exemplary logical data map 400 of exemplary input data (not shown). Exemplary logical data map 400 comprises a first line 410 (illustrated with diagonal marks) and a second line 420 (illustrated by dashes). Each map line can include a number of sliding windows (e.g., 430, 440, and 450 for the first line 410 and 460, 470, and 480 for the second line 420). Additionally, as is shown, the logical data map 400 shows the ability of the sliding windows to straddle a data dimensional boundary of the input data (e.g., straddling the first line 410 and the second line 420). Such ability allows for increased performance as more data can be prepared more efficiently for subsequent processing by the cooperating neural network processing components (e.g., 205 of FIG. 2).

Figure 5:
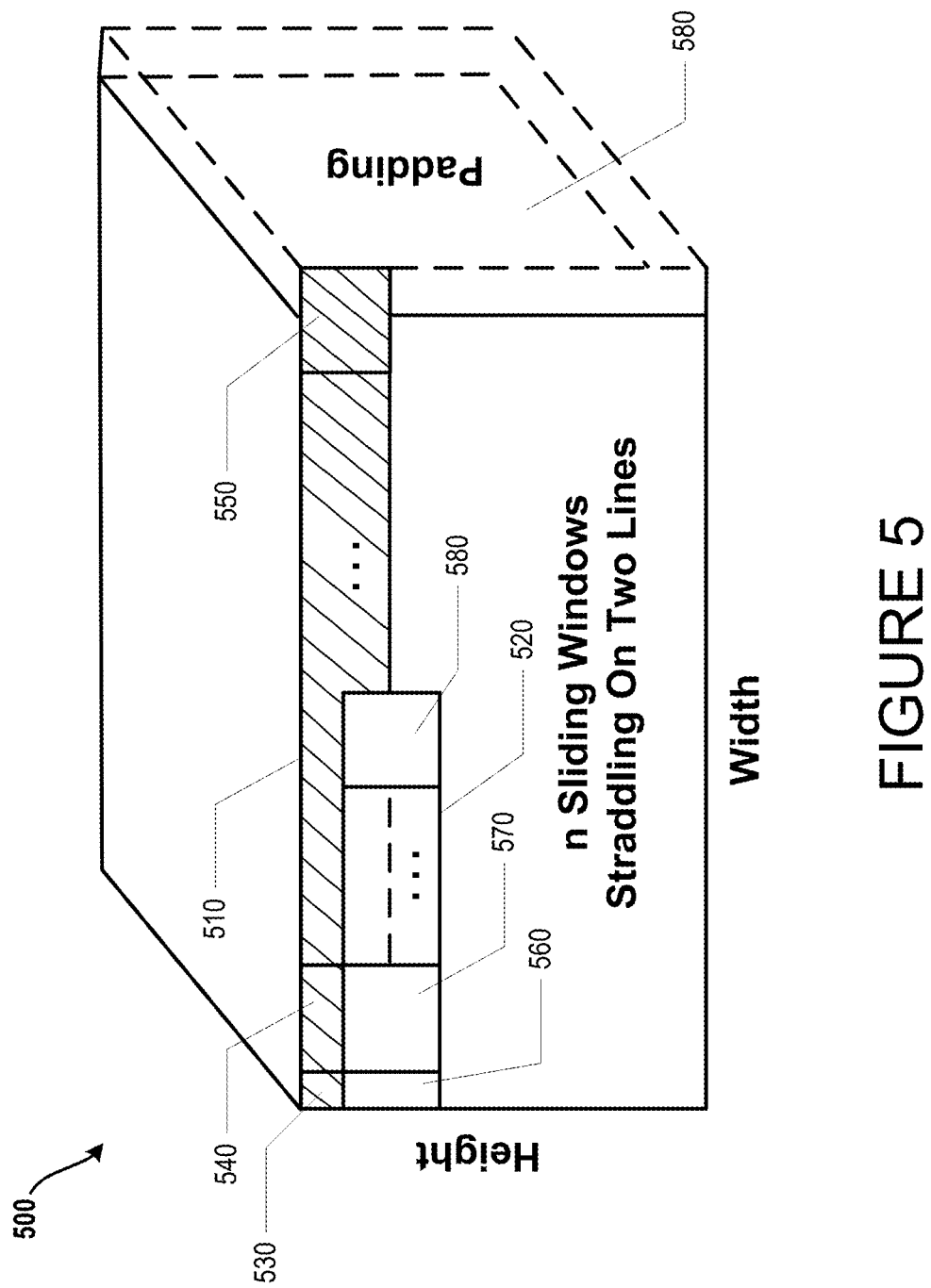
FIG. 5 illustrates a block diagram of exemplary input data represented in an illustrative logical data mapping showing the use of illustrative n sliding windows operative to straddle one or more lines of the illustrative logical data mapping operative to allow for data padding as a processing enhancement in accordance with the herein described systems and methods.

FIG. 5 is similar to FIG. 4 and is presented to describe the ability of the herein described systems and methods to allow for the use of padding to further enhance the performance characteristics of an exemplary neural network environment (e.g., 100 of FIG. 1 and 200 of FIG. 2). As is shown, logical data map 500 (of exemplary input data not shown) can include various sliding windows (530, 540, 550, 560, 570, and 580) that straddle across one or more lines (e.g., 510 and 520). Additionally, the logical data map 500 can also include padding 580.

In an illustrative operation, at runtime of an exemplary neural network environment (100 of FIG. 1 or 200 of FIG. 2), padding 580 can be added dynamically. The operation controller 235 of FIG. 2 can specify the amount of padding to be used on each of the dimensions 340 shown in FIG. 3 (e.g., such that the dimensions taken collectively can be considered a data volume) of the input data (e.g., blob), and the neural network environment (e.g., iterator controller instructions) can operatively construct data volumes as if the padding was physically present in memory. Default values can also be generated by the exemplary neural network environment (e.g., iterator controller instructions) in the iterator output positions where the padding was added.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

FIG. 6 is a diagram showing the interaction of various components of an exemplary computing environment 600 operative to perform bandwidth control of an exemplary fabric interface. As is shown, exemplary neural network environment comprises DNN module 610 cooperating with an exemplary CPU 615, fabric 650, fabric memory 620, and local memory 625. In an illustrative operation, exemplary computing environment 600 can identify various exemplary transactions 605 that are required to be processed by computing environment 600. As is shown in FIG. 6, exemplary transactions can comprise a memory type transaction (e.g., 605(*a*), 605(*b*), 605(*c*), 605(*e*), 605(*f*), 605(*h*), and 605(*i*)) as well as operation transactions (e.g., 605(*d*), and 605(*g*)). Each of the transactions can include an identification (ID) and a field dependency parameter (FLD). The ID and FLD operatively being used by exemplary computing environment 600 to identify the resources that are required to perform the exemplary transaction.

In the illustrative operation, based on the transaction list, DNN module 610 cooperating with CPU 615 can calculate the overall system resources required to perform the exemplary transactions of transaction list 605 as well as calculating and selecting one or more throttling parameters that can be executed on the fabric memory 620, local memory 625, and/or fabric 650 to optimize the use of available processing/memory resources in an effort to reduce overall power consumption of exemplary computing environment 600. In an illustrative operation, the selected executed throttling parameter can comprise inserting time gaps in between fabric memory (620) operations during a network transaction processing cycle such that data elements (630, 635, and 640) can be written in a non-gap form from the fabric memory to a local memory by an exemplary cooperating DMA module. The data elements written in the local memory can then be consumed by one or more processing units such as neurons. This operation allows for more direct data access from a local memory component by the cooperating processing units resulting in fewer transaction cycles and ultimately lower consumption of power.

In an illustrative implementation, the size of fabric 650 can be selected such that when one or more calculated selected throttling parameters are executed, one or more cooperating processing units are fully utilize during the transaction sequences. In an illustrative implementation, the selected throttling parameter for execution can be targeted to a selected cooperating memory component. For example, throttling can be targeted to traffic only going to one data source, like DRAM. In an illustrative operation, an exemplary DMA module is able to move data from SRAM to SRAM and from SRAM to DRAM and from DRAM to DRAM and from tightly coupled memory (TCM) to SRAM, etc. As such, selected memories can be specified as a shared resource and transactions can be throttled only for that selected memory.

FIG. 7 is a flow diagram of an illustrative process 700 performing bandwidth control of an exemplary fabric interface of an exemplary computing environment resulting in reduced overall power consumption of the exemplary computing environment. As is shown, processing begins at block 705 where one or more system parameters from a cooperating component of the exemplary computing environment are received, the system parameters being representative of the required processing and/or memory resources required to process input data. Processing proceeds to block 710 where the total available memory on the external fabric (e.g., system fabric) is calculated to determine an overall system load. Processing then proceeds to block 715 where one or more throttling parameters are calculated using the system parameters and/or calculated system load, the calculated throttling parameters being representative of throttling the processing and/or memory management of input data.

Processing then proceeds to block 720 where one or more throttling parameters are selected for execution, the selected throttling parameter being operatively executed by an exemplary DMA component. The exemplary DMA component further operative at block 725 to cooperate with one or more cooperating memory components of the exemplary computing environment to execute the selected throttling parameter (e.g., gap insertion, limiting transaction count, cycling one or more processing units such as neurons during a transaction sequence), the one or more memory components being operatively coupled to an external fabric component of the exemplary computing environment.

Processing then proceed to block 730 where a check is performed to determine if there is additional data that requires processing. If there is no additional data, processing terminated at block 735. If additional data requires processing, processing reverts to block 710 and proceeds from there.

The exemplary processing described in FIG. 7 can be applied in various operations performed in the illustrative neural network environment including but not limited to quality of service operations, DNN quiesce operations, and hardware debugging operations. In an illustrative implementation, quality of service operations can be performed in context to the herein described systems and methods wherein an exemplary DNN environment can comprise multiple DNNs such that one DNN may have a higher processing priority than another. In such instance, the DNN with the higher priority could be provided a more advantageous throttle setting than the DNN with the lower priority. In doing so, the higher priority DNN can be provided better access to the fabric during processing.

In another illustrative implementation, the DNN can be quiesced without having to completely shut down or pausing the DNN module(s) in the illustrative DNN environment. In this illustrative implementation, a very large gap (e.g., thousands of cycles) can be inserted between transactions which can have the effect of quiescing the DNN since a stoppage in data movement can result.

In another illustrative implementation, hardware debugging operations can be performed such that data patterns can be slowed down in an observed hardware component to such a rate that they can be observed by various instrumentation such as oscilloscopes and logic analyzers. Additionally, with such approach the data transactions can be isolated during the debug operation. By way of example, the unloaded latency of a DMA can be measured such that a transaction could be isolated using large gaps before and after the transaction and external instrumentation can be used to measure the effect of the DMA on an overall computing environment.

Figure 8:
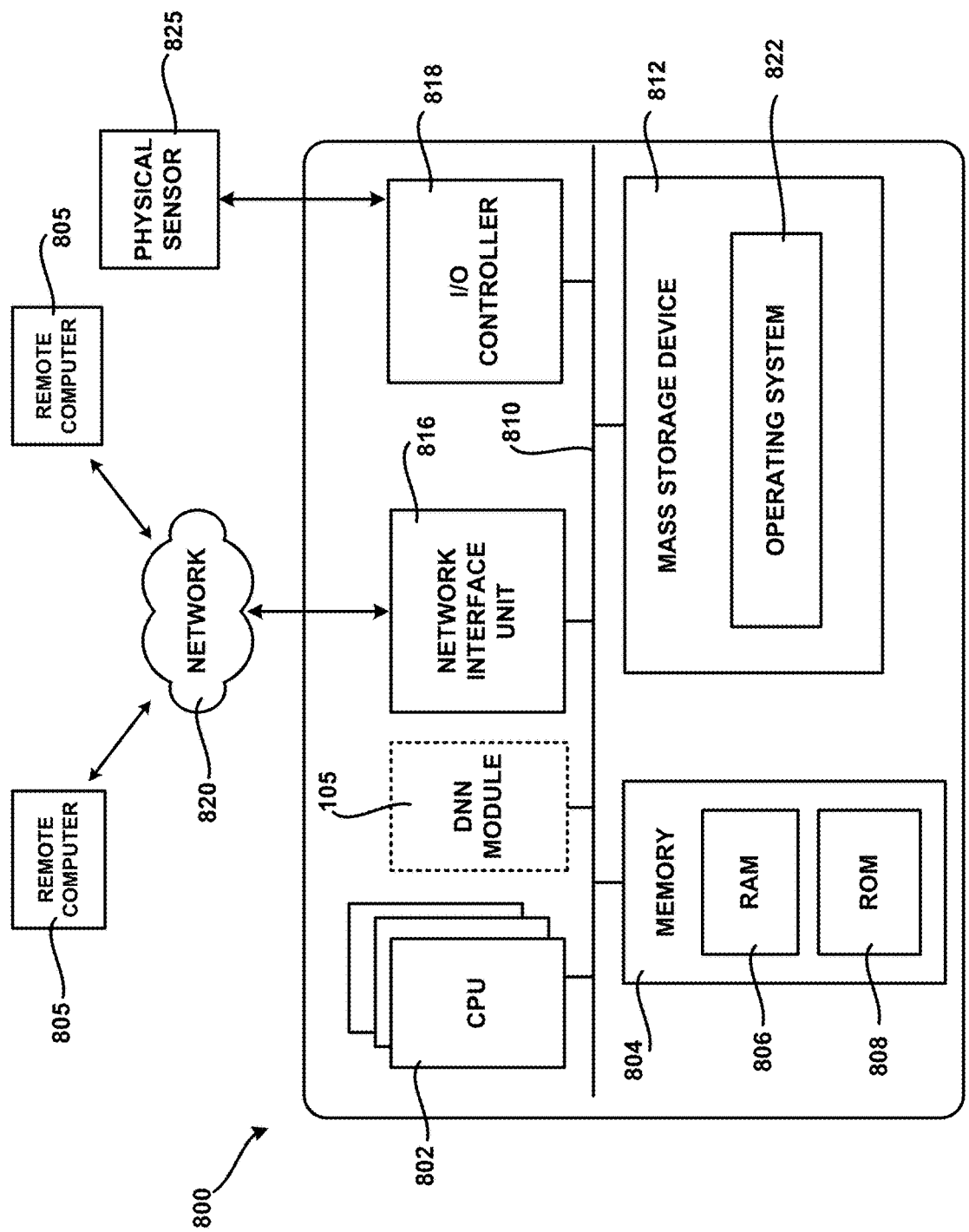
FIG. 8 is a computer architecture diagram showing an illustrative computer hardware and software architecture for a computing device that can act as an application host for the DNN module presented herein, according to one embodiment.

FIG. 8 is a computer architecture diagram showing an illustrative computer hardware and software architecture for a computing device that can act as an application host for the DNN module 105 presented herein. In particular, the architecture illustrated in FIG. * can be utilized to implement a server computer, mobile phone, an e-reader, a smartphone, a desktop computer, an AR/VR device, a tablet computer, a laptop computer, or another type of computing device suitable for use with the DNN module 105.

The computer 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system ("BIOS" or "firmware") containing the basic routines that help to transfer information between elements within the computer 800, such as during startup, can be stored in the ROM 808. The computer 800 further includes a mass storage device 812 for storing an operating system 822, application programs, and other types of programs. The mass storage device 812 can also be configured to store other types of programs and data.

The mass storage device 812 is connected to the CPU 802 through a mass storage controller (not shown) connected to the bus 810. The mass storage device 812 and its associated computer readable media provide non-volatile storage for the computer 800. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 800. For purposes of the claims, the phrase "computer storage medium," and variations thereof, does not include waves or signals per se or communication media.

According to various configurations, the computer 800 can operate in a networked environment using logical connections to remote computers through a network such as the network 820. The computer 800 can connect to the network 820 through a network interface unit 816 connected to the bus 810. It should be appreciated that the network interface unit 816 can also be utilized to connect to other types of networks and remote computer systems. The computer 800 can also include an input/output controller 818 for receiving and processing input from a number of other devices, including a keyboard, mouse, touch input, an electronic stylus (not shown in FIG. 8), or a physical sensor such as a video camera. Similarly, the input/output controller 818 can provide output to a display screen or other type of output device (also not shown in FIG. 8).

It should be appreciated that the software components described herein, when loaded into the CPU 802 and executed, can transform the CPU 802 and the overall computer 800 from a general-purpose computing device into a special-purpose computing device customized to facilitate the functionality presented herein. The CPU 802 can be constructed from any number of transistors or other discrete circuit elements, which can individually or collectively assume any number of states. More specifically, the CPU 802 can operate as a finite-state machine, in response to executable instructions contained within the software modules disclosed herein. These computer-executable instructions can transform the CPU 802 by specifying how the CPU 802 transitions between states, thereby transforming the transistors or other discrete hardware elements constituting the CPU 802.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 800 in order to store and execute the software components presented herein. It also should be appreciated that the architecture shown in FIG. 8 for the computer 800, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 800 might not include all of the components shown in FIG. 8, can include other components that are not explicitly shown in FIG. 8, or can utilize an architecture completely different than that shown in FIG. 8.

Figure 9:
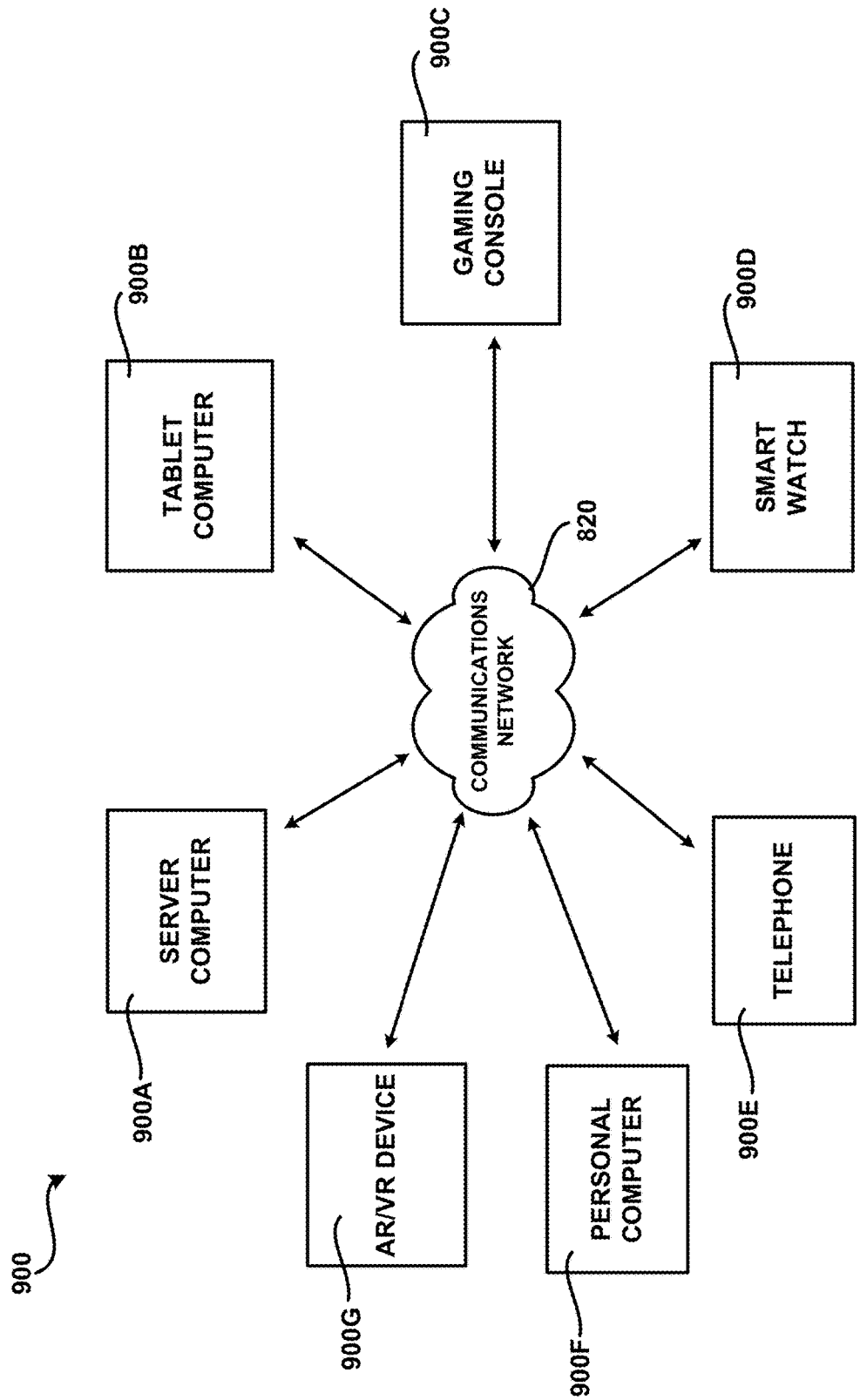
FIG. 9 is a network diagram illustrating a distributed computing environment in which aspects of the disclosed technologies can be implemented, according to various embodiments presented herein.

FIG. 9 is a network diagram illustrating a distributed network computing environment 900 in which aspects of the disclosed technologies can be implemented, according to various embodiments presented herein. As shown in FIG. 9, one or more server computers 900A can be interconnected via a communications network *20 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 900B, a gaming console 900C, a smart watch 900D, a telephone 900E, such as a smartphone, a personal computer 900F, and an AR/VR device 900G.

In a network environment in which the communications network *20 is the Internet, for example, the server computer 900A can be a dedicated server computer operable to process and communicate data to and from the client computing devices 900B-900G via any of a number of known protocols, such as, hypertext transfer protocol ("HTTP"), file transfer protocol ("FTP"), or simple object access protocol ("SOAP"). Additionally, the networked computing environment 900 can utilize various data security protocols such as secured socket layer ("SSL") or pretty good privacy ("PGP"). Each of the client computing devices 900B-900G can be equipped with an operating system operable to support one or more computing applications or terminal sessions such as a web browser (not shown in FIG. 9), or other graphical user interface (not shown in FIG. 9), or a mobile desktop environment (not shown in FIG. 9) to gain access to the server computer 900A.

The server computer 900A can be communicatively coupled to other computing environments (not shown in FIG. 9) and receive data regarding a participating user's interactions/resource network. In an illustrative operation, a user (not shown in FIG. 9) may interact with a computing application running on a client computing device 900B-900G to obtain desired data and/or perform other computing applications.

The data and/or computing applications may be stored on the server 900A, or servers 900A, and communicated to cooperating users through the client computing devices 900B-900G over an exemplary communications network 820. A participating user (not shown in FIG. 9) may request access to specific data and applications housed in whole or in part on the server computer 900A. These data may be communicated between the client computing devices 900B-900G and the server computer 900A for processing and storage.

The server computer 900A can host computing applications, processes and applets for the generation, authentication, encryption, and communication of data and applications, and may cooperate with other server computing environments (not shown in FIG. 9), third party service providers (not shown in FIG. 9), network attached storage ("NAS") and storage area networks ("SAN") to realize application/data transactions.

It should be appreciated that the computing architecture shown in FIG. 8 and the distributed network computing environment shown in FIG. 9 have been simplified for ease of discussion. It should also be appreciated that the computing architecture and the distributed computing network can include and utilize many more computing components, devices, software programs, networking devices, and other components not specifically described herein.

Example Clauses

The disclosure presented herein may be considered in view of the following clauses.

Example Clause A, a system for enhanced data processing in a computing environment (200), the system comprising, at least one neural network processor (105), at least one memory component (220, 225) and at least one memory (210) in communication with the at least one neural network processor (105), the at least one memory (210) having computer-readable instructions stored thereupon that, when executed by the at least one processor, cause the at least one processor to: receive one or more processing parameters from a cooperating component of the computing environment (200) representative of required processing and memory resources require to process input data; calculate the total available memory on a cooperating fabric component (230) of the computing environment (200) to determine a load parameter for the computing environment (200); calculate one or more throttling parameters using the received on or more processing parameters and the calculated load parameter; select one or more of the calculated throttling parameters for execution; and throttle one or more cooperating memory components (210, 220, 225) of the computing environment (200) by executing the selected one or more calculated throttling parameters.

Example Clause B, the system of Example Clause A, wherein the throttling is performed by a cooperating DMA component of the computing environment (200).

Example Clause C, the system of claim Example Clause A and B, wherein the calculated throttling parameters comprise transaction limits and gap insertion.

Example Clause D, the system of Example Clauses A through C, wherein the computer-readable instructions further cause the at least one processor to configure a cooperating configurable register on the one or more cooperating memory components according to the calculated throttling parameters.

Example Clause E, the system of Example Clauses A through D, wherein the number of transactions being processed by the exemplary neural network processor of the computing environment are limited to a threshold below the maximum bandwidth of one or more of the cooperating memory components.

Example Clause F, the system of Example Clauses A through E, wherein cooperating memory component comprises an external fabric component.

Example Clause G, the system of Example Clauses A through F, wherein the limited number of transactions being processed by the exemplary neural network processor according to a selected threshold comprising a specified number of outstanding transactions and a specified number of cycles between transactions.

Example Clause H, a computer-implemented method, comprising, receiving one or more processing parameters from a cooperating component of the computing environment (200) representative of required processing and memory resources require to process input data; calculating the total available memory on a cooperating fabric component (230) of the computing environment (200) to determine a load parameter for the computing environment (200); calculating one or more throttling parameters using the received on or more processing parameters and the calculated load parameter; selecting one or more of the calculated throttling parameters for execution; and throttling one or more cooperating memory components (210, 220, 225) of the computing environment (200) by executing on a one or more cooperating memory components the selected one or more calculated throttling parameters, the parameters comprising inserting a gap between transactions processed by a neural network processor of an exemplary computing environment and limiting the number of transactions processed by a neural network processor of an exemplary computing environment.

Example Clause I, the computer-implemented method of Example Clause H, further comprising receiving instructions from a control computer processing unit capable of executing the calculated throttling parameters.

Example Clause J, the computer-implemented method of Example Clauses H and I, further comprising configuring a configurable register with data elements from the calculated throttling parameters for use in performing throttling.

Example Clause K, the computer-implemented method of Example Clauses H through J, further comprising setting a transaction threshold parameter value comprising a specified number of outstanding transactions and a specified number of cycles between transactions for use in throttling.

Example Clause L, the computer-implemented method of Example Clauses H through K, further comprising utilizing the set transaction threshold parameter by a neural network processor of a computing environment during throttling.

Example Clause M, the computer-implemented method of Example Clauses H through L, further comprising selecting one or more memory components on which to perform throttling.

Example Clause N, the computer-implemented method of Example Clauses H through M, further comprising providing one or more throttling instructions to an external fabric component comprising the calculated throttling parameters.

Example Clause O, the computer-implemented method of claim Example Clauses H through N, further comprising communicating with one or more memory management components of a computing environment comprising fabric clients to affect one or more operations comprising quality of service operations, hardware quiesce operations, and hardware debugging operations.

Example Clause P, a computer-readable storage medium having computer-executable instructions stored thereupon which, when executed by one or more processors of a computing device, cause the one or more processors of the computing device to: receive one or more processing parameters from a cooperating component of the computing environment (200) representative of required processing and memory resources require to process input data; calculate the total available memory on a cooperating fabric component (230) of the computing environment (200) to determine a load parameter for the computing environment (200); calculate one or more throttling parameters using the received on or more processing parameters and the calculated load parameter; select one or more of the calculated throttling parameters for execution; and throttle one or more cooperating memory components (210, 220, 225) of the computing environment (200) by executing the selected one or more calculated throttling parameters.

Example Clause Q, the computer-readable storage medium of Example Clause P, wherein the instructions further cause the one or more processors of the computing device to: configure a configurable register resident on one or more cooperating memory components with data elements from the calculated throttling parameters for use in performing throttling.

Example Clause R, the computer-readable storage medium of Example Clause P and Q, wherein the instructions further cause the one or more processors of the computing device to: receive one or more instructions from a control computer processing unit capable of executing the calculated throttling parameters.

Example Clause S, the computer-readable storage medium of Example Clause P through R, wherein the instructions further cause the one or more processors of the computing device to: set a transaction threshold parameter value comprising a specified number of outstanding transactions and a specified number of cycles between transactions for use in throttling.

Example Clause T, the computer-readable storage medium of Example Clauses P through S, wherein the instructions further cause the one or more processors of the computing device to: select one or more memory components on which to perform throttling.

Example Clause U, the computer readable medium of Example Clauses P through T, wherein the memory component cooperates with a physical sensor capable of producing input data comprising audio data, video data, haptic sensory data, and other data for subsequent processing by the one or more cooperating processing units.

Example Clauses V, the computer readable medium of Example Clauses P through U, wherein the cooperating processing units electronically cooperate with one or more output physical components operative to receive for human interaction processed input data comprising audio data, video data, haptic sensory data and other data.

Based on the foregoing, it should be appreciated that fabric bandwidth control resulting in enhanced processing performance and lower power consumption of a DNN module has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A system for enhanced data processing in a computing environment, the system comprising:
    at least one neural network processor communicatively coupled to a host application processor system on chip and configured to support a plurality of data types;
    at least one memory component; and
    at least one memory in communication with the at least one neural network processor, the at least one memory having computer-readable instructions stored thereupon that, when executed by the at least neural network one processor, cause the at least one neural network processor to:
    compute a weighted sum of input data and pass the weighted sum through one of an activation function or a transfer function;
    determine a load parameter for the computing environment based on a total available memory on a cooperating fabric component of the computing environment;
    calculate one or more throttling parameters using the determined load parameter and one or more processing parameters indicative of processing and memory resources required to process the input data;
    select one or more of the calculated throttling parameters; and
    throttle one or more cooperating memory components of the computing environment using the selected one or more calculated throttling parameters.

2. The system of claim 1, wherein the neural network processor is connected to the host application processor system on chip through a PCIe interface.

3. The system of claim 1, wherein the data types comprise one or more of weights, input data/feature maps, and activation data.

4. The system of claim 1, wherein the neural network processor is configured to operate on layer descriptors that correspond to layers of a neural network.

5. The system of claim 4, wherein the layer descriptors comprise one or more of memory-to-memory move descriptors, configuration descriptors, and operation descriptors.

6. The system of claim 1, wherein the throttling is performed by a cooperating DMA component of the computing environment.

7. The system of claim 6, wherein the calculated throttling parameters comprise transaction limits and gap insertion.

8. The system of claim 7, wherein the computer-readable instructions further cause the at least one neural network processor to configure a cooperating configurable register on the one or more cooperating memory components according to the calculated throttling parameters.

9. The system of claim 8, wherein a number of transactions being processed by the neural network processor of the computing environment are limited to a threshold below the maximum bandwidth of one or more of the cooperating memory components.

10. The system of claim 9, wherein cooperating memory component comprises an external fabric component.

11. The system of claim 8, wherein the limited number of transactions being processed by the neural network processor is further determined according to a selected threshold comprising a specified number of outstanding transactions and a specified number of cycles between transactions.

12. A method for enhanced data processing in a computing environment, the method performed by a system comprising at least one neural network processor communicatively coupled to a host application processor system on chip and configured to support a plurality of data types, the method comprising:
    computing a weighted sum of input data and pass the weighted sum through one of an activation function or a transfer function;
    determining a load parameter for the computing environment based on a total available memory on a cooperating fabric component of the computing environment;
    calculating one or more throttling parameters using the determined load parameter and one or more processing parameters indicative of processing and memory resources required to process the input data;
    selecting one or more of the calculated throttling parameters; and
    throttling one or more cooperating memory components of the computing environment using the selected one or more calculated throttling parameters.

13. The method of claim 12, wherein the neural network processor is connected to the host application processor system on chip through a PCIe interface.

14. The method of claim 12, wherein the data types comprise one or more of weights, input data/feature maps, and activation data.

15. The method of claim 12, wherein the neural network processor is configured to operate on layer descriptors that correspond to layers of a neural network.

16. The method of claim 15, wherein the layer descriptors comprise one or more of memory-to-memory move descriptors, configuration descriptors, and operation descriptors.

17. A neural network processor communicatively coupled to a host application processor system on chip and configured to support a plurality of data types, the neural network processor configured to:
    compute a weighted sum of input data and pass the weighted sum through one of an activation function or a transfer function;
    determine a load parameter for a computing environment of the neural network processor, the load parameter determined based on a total available memory on a cooperating fabric component of the computing environment;
    calculate one or more throttling parameters using the determined load parameter and one or more processing parameters indicative of processing and memory resources required to process the input data;
select one or more of the calculated throttling parameters; and
throttle one or more cooperating memory components of the computing environment using the selected one or more calculated throttling parameters.

18. The neural network processor of claim 17, wherein the neural network processor is connected to the host application processor system on chip through a PCIe interface.

19. The neural network processor of claim 17, wherein the data types comprise one or more of weights, input data/feature maps, and activation data.

20. The neural network processor of claim 17, wherein the neural network processor is configured to operate on layer descriptors that correspond to layers of a neural network, and wherein the layer descriptors comprise one or more of memory-to-memory move descriptors, configuration descriptors, and operation descriptors.

* * * * *